(12) United States Patent
Choi

(10) Patent No.: US 8,629,449 B2
(45) Date of Patent: Jan. 14, 2014

(54) DISPLAY AND MANUFACTURING METHOD OF THE SAME

(75) Inventor: Woong-Sik Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 445 days.

(21) Appl. No.: 13/064,866

(22) Filed: Apr. 21, 2011

(65) Prior Publication Data

US 2011/0291101 A1    Dec. 1, 2011

(30) Foreign Application Priority Data

May 31, 2010    (KR) .................. 10-2010-0051070

(51) Int. Cl.
*H01L 29/04*    (2006.01)
*G02F 1/136*    (2006.01)
*H01L 51/40*    (2006.01)

(52) U.S. Cl.
USPC .......... 257/72; 257/59; 257/E33.064; 438/34; 438/99; 438/149; 349/42; 349/43

(58) Field of Classification Search
CPC .. H01L 27/1214; H01L 27/3262; H01L 51/56
USPC .............. 257/40, 59, 72, E33.064, E27.131; 438/29, 34, 69, 82, 99, 149; 349/38, 349/42, 43
See application file for complete search history.

(56) References Cited

U.S. PATENT DOCUMENTS

| 7,279,714 | B2 * | 10/2007 | Koo et al. ................ 257/72 |
| 7,405,432 | B2 * | 7/2008 | Adachi .................... 257/84 |
| 2004/0012345 | A1 | 1/2004 | Busse et al. |
| 2008/0296574 | A1 * | 12/2008 | Cheng et al. ............. 257/59 |
| 2010/0255617 | A1 * | 10/2010 | Choi ...................... 438/23 |

FOREIGN PATENT DOCUMENTS

| JP | 2007-158290 A | 6/2007 |
| KR | 10-0629685 B1 | 5/2001 |
| KR | 10-0527086 B1 | 3/2003 |
| KR | 10 2005-0003496 A | 1/2005 |
| KR | 10 2005-0024594 A | 3/2005 |
| KR | 10-0584715 B1 | 10/2005 |
| KR | 10-0685803 B1 | 6/2006 |

* cited by examiner

*Primary Examiner* — Kenneth Parker
*Assistant Examiner* — Jose R Diaz
(74) *Attorney, Agent, or Firm* — Lee & Morse, P.C.

(57) ABSTRACT

A display, including a substrate, a plurality of signal wires, a first gate electrode, a second gate electrode, a gate insulating layer, a first semiconductor layer including a first source/drain region doped with a p-type impurity, a second semiconductor layer including a second source/drain region doped with an n-type impurity, a planarization layer having a first contact hole exposing a portion of the first source/drain region, a second contact hole exposing a portion of the second source/drain region, and a third contact hole exposing a portion of any one of the signal wires, a first connection electrode, a second connection electrode, a lower electrode, an organic film layer, and an upper electrode.

20 Claims, 8 Drawing Sheets

DISPLAY AND MANUFACTURING METHOD OF THE SAME

BACKGROUND

1. Field

Embodiments relate to a display and a manufacturing method of the same.

2. Description of the Related Art

In flat panel display, an organic light emitting diode (OLED) display is a display that uses a phenomenon in which light of a specific wavelength is produced by energy of an exciton formed by recombination of an electron and a hole injected into an organic thin film through the cathode electrode and the anode electrode.

The organic light emitting diode displays may be classified into a passive matrix type and an active matrix type in accordance with the driving method. The active matrix type organic light emitting diode display may have two thin film transistors (TFT) in order to driving an organic light emitting diode including the organic thin film, for example, a driving transistor for applying driving current to the organic light emitting diode and a switching transistor determining on/off of the driving transistor by transmitting a data signal to the driving transistor. Thus, manufacturing may be more complicated in comparison to the passive type organic light emitting diode display.

However, the passive type organic light emitting diode display may have low resolution and the application field may be limited to small displays due to the factors such as resolution, increase of driving voltage, and reduction of material life-span, whereas the active matrix type organic light emitting diode display may provide stable luminance in accordance with supplied constant current by using a switching transistor and a driving transistor disposed in each pixel of the display region, such that it may provide low power consumption, and may be implemented in high resolution and large displays.

The above information disclosed in this Background section is only for enhancement of understanding of the background of the described technology and therefore it may contain information that does not form the prior art.

SUMMARY

It is a feature of an embodiment to provide an organic light emitting diode display formed using CMOS structures.

It is another feature of an embodiment to provide an organic light emitting diode display configured to be formed using a low number of masks.

At least one of the above and other features and advantages may be realized by providing a display, including a substrate including a first region, a second region, and a third region; a plurality of signal wires disposed in the first region on the substrate; a first gate electrode disposed in the second region on the substrate; a second gate electrode disposed in the third region on the substrate; a gate insulating layer disposed on the signal wires, the first gate electrode, and the second gate electrode; a first semiconductor layer disposed in the first region of the gate insulating layer and including a first source/drain region doped with a p-type impurity; a second semiconductor layer disposed in the second region of the gate insulating layer and including a second source/drain region doped with an n-type impurity; a planarization layer disposed on the first semiconductor layer and the second semiconductor layer and having a first contact hole exposing a portion of the first source/drain region, a second contact hole exposing a portion of the second source/drain region, and a third contact hole exposing a portion of any one of the signal wires; a first connection electrode disposed on the planarization layer and connecting one side of the first source/drain region and one side of the second source/drain region through the first contact hole and the second contact hole; a second connection electrode disposed on the planarization layer and connecting the other side of the first source/drain region with any one of the signal wires through the first contact hole and the third contact hole; a lower electrode disposed on the planarization layer and connected with the other side of the second source/drain region through the second contact hole; an organic film layer including one or a plurality of emission layers on the lower electrode; and an upper electrode disposed on the organic film layer. The signal wires, the first gate electrode, and the second gate electrode may be made of a same material.

The signal wires, the first gate electrode, and the second gate electrode may be made of molybdenum-tungsten, molybdenum, tungsten silicide, molybdenum silicide, aluminum, or alloys thereof.

The signal wires, the first gate electrode, and the second gate electrode may be made of a same material.

The n-type impurity may be phosphorous (P), arsenic (As), antimony (Sb), or bismuth (Bi).

The p-type impurity may be boron (B), aluminum (Al), gallium (Ga), or indium (In).

The lower electrode, the first connection electrode, and the second connection electrode may each include a reflective layer and a transparent conductive layer.

The lower electrode, the first connection electrode, and the second connection electrode may be made of a same material.

The signal wire connected with the second connection electrode through the first contact hole may be a power source voltage line.

The display may further include a protective layer disposed between the first semiconductor layer and the second semiconductor layer and planarization layer.

The display may further include a capacitor lower electrode disposed on the same layer as the signal wires, the first gate electrode, and the second gate electrode; and a capacitor upper electrode disposed on the same layer as the first semiconductor layer, and the second semiconductor layer.

The display may further include a capacitor lower electrode, the capacitor lower electrode being formed of a same material as the signal wires, the first gate electrode, and the second gate electrode; a capacitor dielectric, the capacitor dielectric being formed of a same material as the gate insulating layer; and a capacitor upper electrode, the capacitor upper electrode being formed of a same material as the first semiconductor layer and the second semiconductor layer.

At least one of the above and other features and advantages may also be realized by providing a method of manufacturing a display, the method including providing a substrate, the substrate including a first region, a second region, and a third region; forming a first conductive material layer on the substrate; forming a plurality of signal wires in the first region, a first gate electrode in the second region, and a second gate electrode in the third region, by etching the first conductive material layer; forming a gate insulating layer on the signal wires, the first gate electrode, and the second gate electrode; forming a polysilicon layer on the gate insulating layer; doping a predetermined region of the polysilicon in the second region with a p-type impurity; doping a predetermined region of the polysilicon in the third region with an n-type impurity; forming a first semiconductor layer including the region of the polysilicon layer which is doped with the p-type impurity and a second semiconductor layer including the region of the polysilicon layer which is doped with the n-type impurity, by etching the polysilicon layer; forming a planarization layer on the first semiconductor layer and the second semiconductor layer; forming a first contact hole exposing the region of the first semiconductor layer which is doped with the p-type impurity, a second contact hole exposing the region of the second semiconductor layer which is doped with the n-type impurity, and third contact hole exposing a portion of any one of the signal wires, by etching the planarization layer; forming a first connection electrode connecting one end of the first semiconductor layer with one end of the second semiconductor layer through the first contact hole and the second contact hole, a second connection electrode connecting the other end of the first semiconductor layer with any one of the signal wires through the first contact hole and the third contact hole, and a lower electrode connected with the other end of the second semiconductor layer through the second contact hole, on the planarization layer; and forming an organic film layer including one or a plurality of emission layers, and an upper electrode on the lower electrode.

The conductive layer may be made of tungsten, molybdenum, tungsten silicide, molybdenum silicide, aluminum, or alloys thereof.

Forming the polysilicon layer may include forming an amorphous silicon layer on the gate insulating layer and then crystallizing the amorphous silicon layer.

The n-type impurity may be phosphorous (P), arsenic (As), antimony (Sb), or bismuth (Bi).

The p-type impurity may be boron (B), aluminum (Al), gallium (Ga), or indium (In).

The lower electrode, the first connection electrode, and the second connection electrode may each be formed to include a reflective layer and a transparent conductive layer.

The signal wire connected with the second connection electrode through the first contact hole may be a power source voltage line.

The method may further include forming a protective layer on the first semiconductor layer and the second semiconductor layer; forming a planarization layer on the protective layer; and forming the contact hole, the second contact hole, and the third contact holes by etching the protective layer and the planarization layer.

The method may further include forming a capacitor lower electrode simultaneously with the signal wires, the first gate electrode, and the second gate electrode, and forming a capacitor upper electrode simultaneously with the first semiconductor layer and the second semiconductor layer in etching the polysilicon layer.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
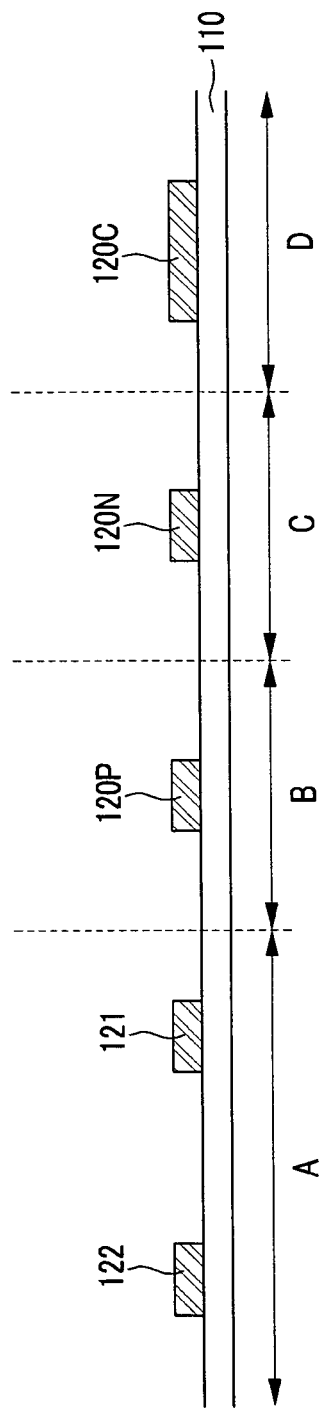
FIGS. 1 to 8 illustrate cross-sectional views sequentially illustrating stages in a method of manufacturing an organic light emitting diode display according to an example embodiment.

Korean Patent Application No. 10-2010-0051070, filed on May 31, 2010, in the Korean Intellectual Property Office, and entitled: "Display and Manufacturing Method of the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1 to 8 illustrate cross-sectional views sequentially illustrating stages in a method of manufacturing an organic light emitting diode display according to an example embodiment.

A method of manufacturing an organic light emitting diode display according to an example embodiment will now be described with reference to FIGS. 1 to 8. Referring to FIG. 1, first, a first conductive material layer (not shown) may be formed on a substrate 110 made of glass, synthetic resin, stainless steel, etc., and including a first region A, a second region B, a third region C, and a fourth region D. Then, a plurality of signal wires 121, 122 disposed in the first region A, a first gate electrode 120P disposed in the second region B, a second gate electrode 120N disposed in the third region C, and a capacitor lower electrode 120C disposed in the fourth region D may be formed on the substrate 110 by etching the first conductive material layer with a first mask (not shown).

The first conductive material layer may be a single layer made of, e.g., any one selected from molybdenum-tungsten (MoW), tungsten (W), molybdenum (Mo), tungsten silicide (WSi$_2$), molybdenum silicide (MoSi$_2$), chromium (Cr), aluminum (Al), and alloys of thereof, or a multilayer formed by stacking, e.g., an aluminum alloy on a tungsten (W), chromium (Cr), or molybdenum (Mo) alloy.

The plurality of signal wires 121, 122 may include, e.g., a scan line for applying scan signals, a data line for applying data signals, and a power source voltage line for a supply power source voltage.

Figure 2:
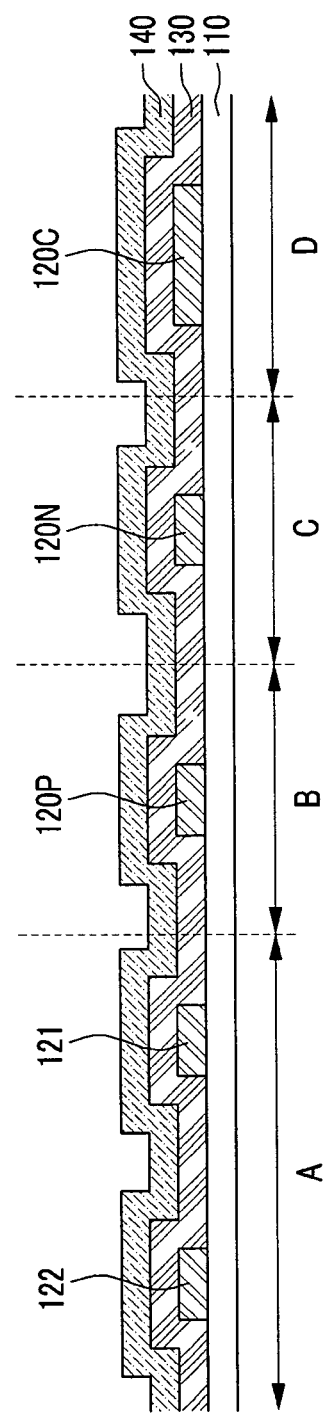

Referring to FIG. 2, a gate insulating layer 130 and a polysilicon layer 140 may be sequentially formed on the substrate 110 including the signal wires 121, 122, the first gate electrode 120P, the second gate electrode 120N, and the capacitor lower electrode 120C.

The polysilicon layer 140 may be formed by, e.g., depositing an amorphous silicon (not shown) on the gate insulating layer 130 and then crystallizing the amorphous silicon layer using, e.g., any one selected from solid phase crystallization (SPC), rapid thermal annealing (RTA), metal induced crystallization (MIC), metal induced lateral crystallization (MILC), excimer laser annealing (ELA) crystallization, and sequential lateral solidification (SLS) crystallization.

Figure 3:
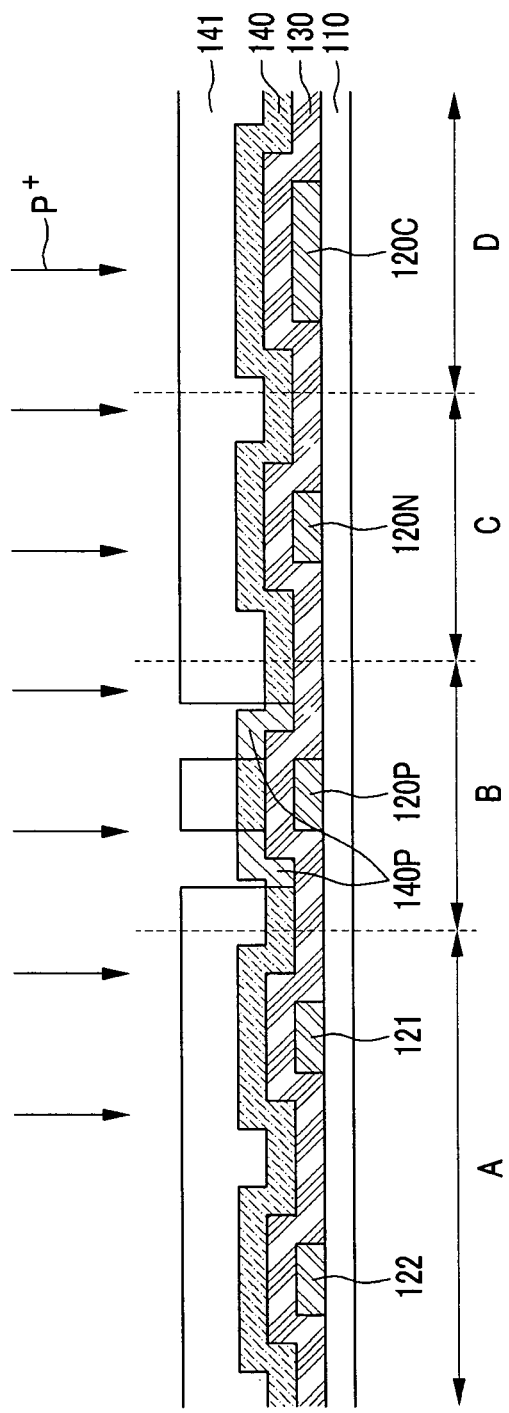

Referring to FIG. 3, a first source/drain region 140P doped with a p-type impurity may be formed in the polysilicon layer 140 in the second region B by forming a first photoresist layer 141, forming an opening exposing a portion of the polysilicon layer 140 in the second region B by patterning the first photoresist layer 141, and then doping the polysilicon layer 140 with a p-type impurity through the patterned opening in the first photoresist layer 141. Here, the first photoresist layer 141 is used as a second mask for doping the polysilicon layer 140. The p-type impurity may be, e.g., any one selected from boron (B), aluminum (Al), gallium (Ga), and indium (In).

Figure 4:
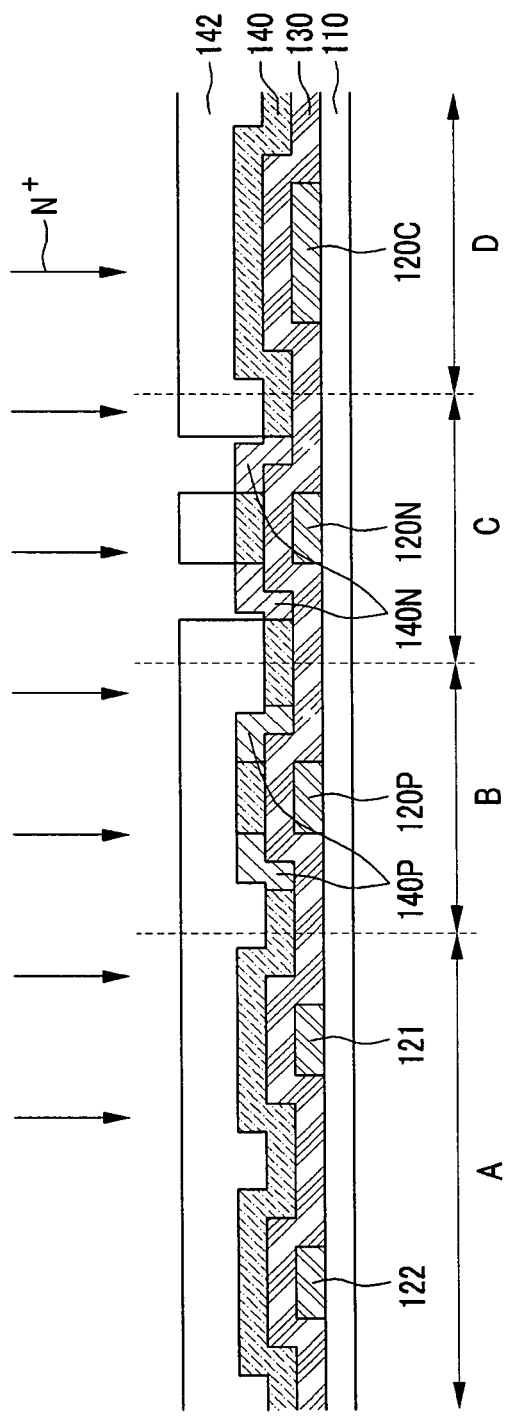

Next, referring to FIG. 4, a second source/drain region 140N doped with an n-type impurity may be formed in the polysilicon layer in the third region C by removing the first photoresist layer 141, forming a second photoresist layer 142, forming an opening exposing a portion of the polysilicon layer 140 in the third region C by patterning the second photoresist layer 142, and then doping the polysilicon layer 140 with an n-type impurity through the patterned opening in the second photoresist layer 142. Here, the second photoresist layer 142 is used as a third mask for doping the polysilicon layer 140. The n-type impurity may be, e.g., any one selected from phosphorous (P), arsenic (As), antimony (Sb), and bismuth (Bi).

Figure 5:
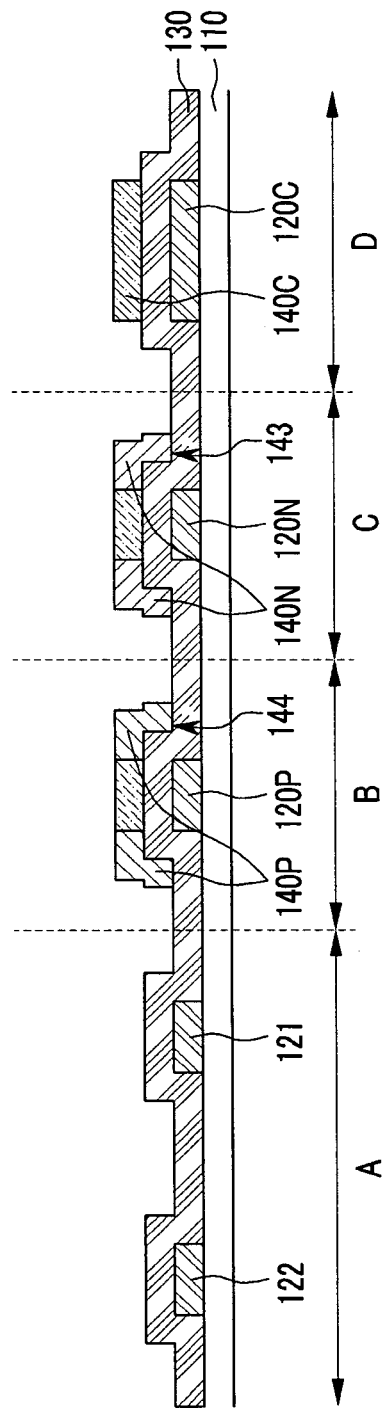

Referring to FIG. 5, a first semiconductor layer 144 including the first source/drain region 140P doped with the p-type impurity in the second region B, a second semiconductor layer 143 including a source/drain region 140N doped with the n-type impurity in the third region C, and a capacitor upper electrode 140C in the fourth region D may be formed by etching the polysilicon layer 140 with a fourth mask (not shown).

Figure 6:
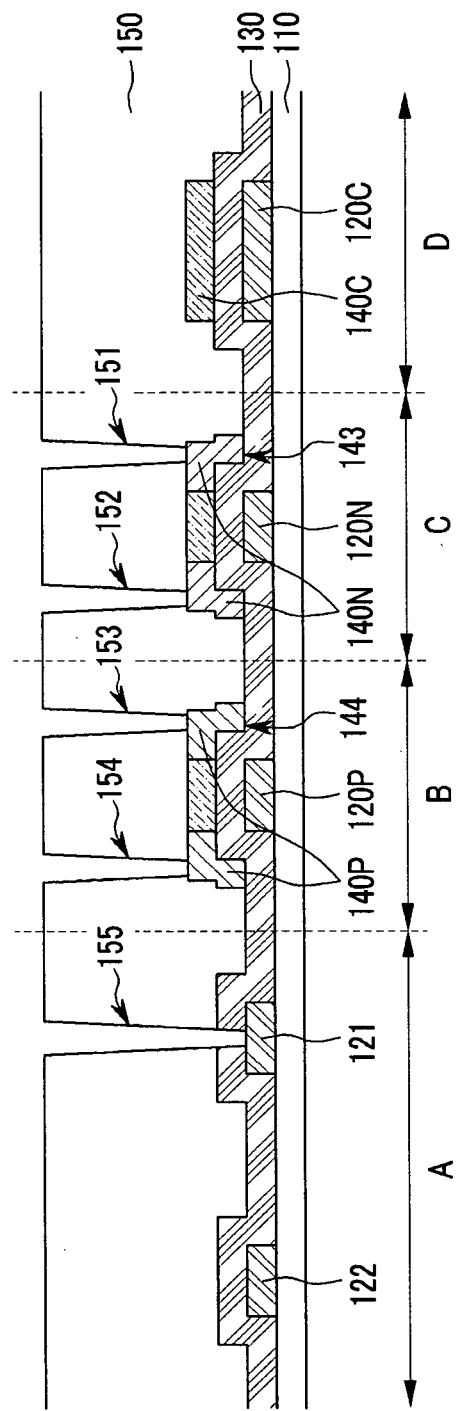

Referring to FIG. 6, a planarization layer 150 may be formed on the substrate 110 including the first semiconductor layer 144, the second semiconductor layer 143, and the capacitor upper electrode 140C. First contact holes 153, 154 exposing a portion of the first source/drain region 140P of the first semiconductor layer 144, second contact holes 151, 152 exposing a portion of the second source/drain region 140N of the second semiconductor layer 143, and a third contact hole 155 exposing a portion of one of the signal wires 121, 122 may be formed by etching the planarization layer 150 with a fifth mask (not shown).

The signal wire 121 exposed by the third contact hole 155 in the signal wires 121, 122 may be selected in accordance with the pixel circuits of the pixels and is preferably a power source voltage line for supplying power source voltage to the pixels in the pixel circuits of common organic light emitting diode display.

Further, the planarization layer 150 may be made of any one selected from benzocyclobutene (BCB), polyimide (PI), polyamide (PA), acryl resin, and phenol resin. In order to further protect the first semiconductor layer 144 and the second semiconductor layer 143, a protective layer (not shown), such as a silicon oxide layer ($SiO_2$), a silicon nitride layer (SiNx), or an inorganic insulating layer having a structure formed by stacking them, may be formed and then the planarization layer 150 may be formed on the substrate 110 including the first semiconductor layer 144, the second semiconductor layer 143, and the capacitor upper electrode 140C.

Figure 7:
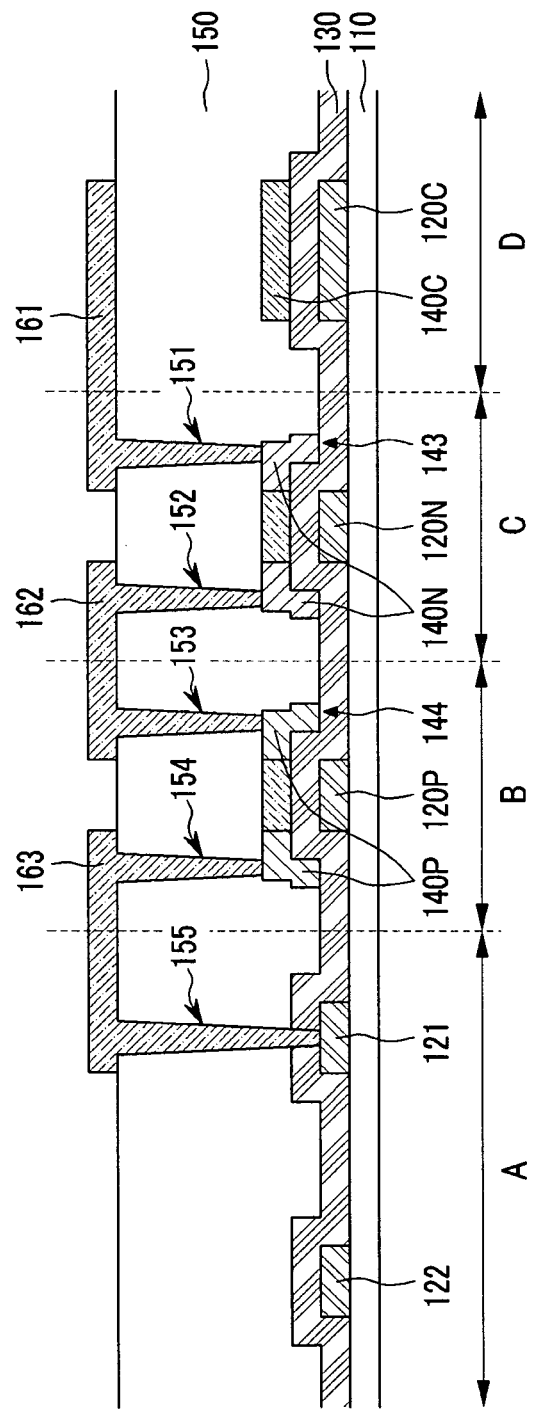

Next, referring to FIG. 7, a first connection electrode 162 connecting one side of the first source/drain region 140P with one side of the second source/drain region 140N through the first contact hole 153 and the second contact hole 152, a second connection electrode 163 connecting the other side of the first source/drain region 140P with the signal wire 121 exposed by the third contact hole 155 in the signal wires 121, 122 through the first contact hole 154 and the third contact hole 155, and a lower electrode 161 connected to the other side of the second source/drain region 140N through the second contact hole 151 are formed by forming a second conductive material layer (not shown) on the planarization layer 150 and then etching the conductive material layer with a sixth mask (not shown).

The second conductive material layer may be a transparent conductive layer, such as ITO and/or IZO, and the first connection electrode 162, the second connection electrode 163, and the lower electrode 161 (which may be formed by etching the second conductive material layer) may include a reflective layer and a transparent conductive layer by, e.g., forming a reflective film layer (not shown) with any one selected from aluminum, an aluminum alloy, silver, and a silver alloy and forming the transparent conductive film layer on the reflective film layer such that the second conductive material layer has a double structure of the reflective film layer and the transparent conductive film layer.

Figure 8:
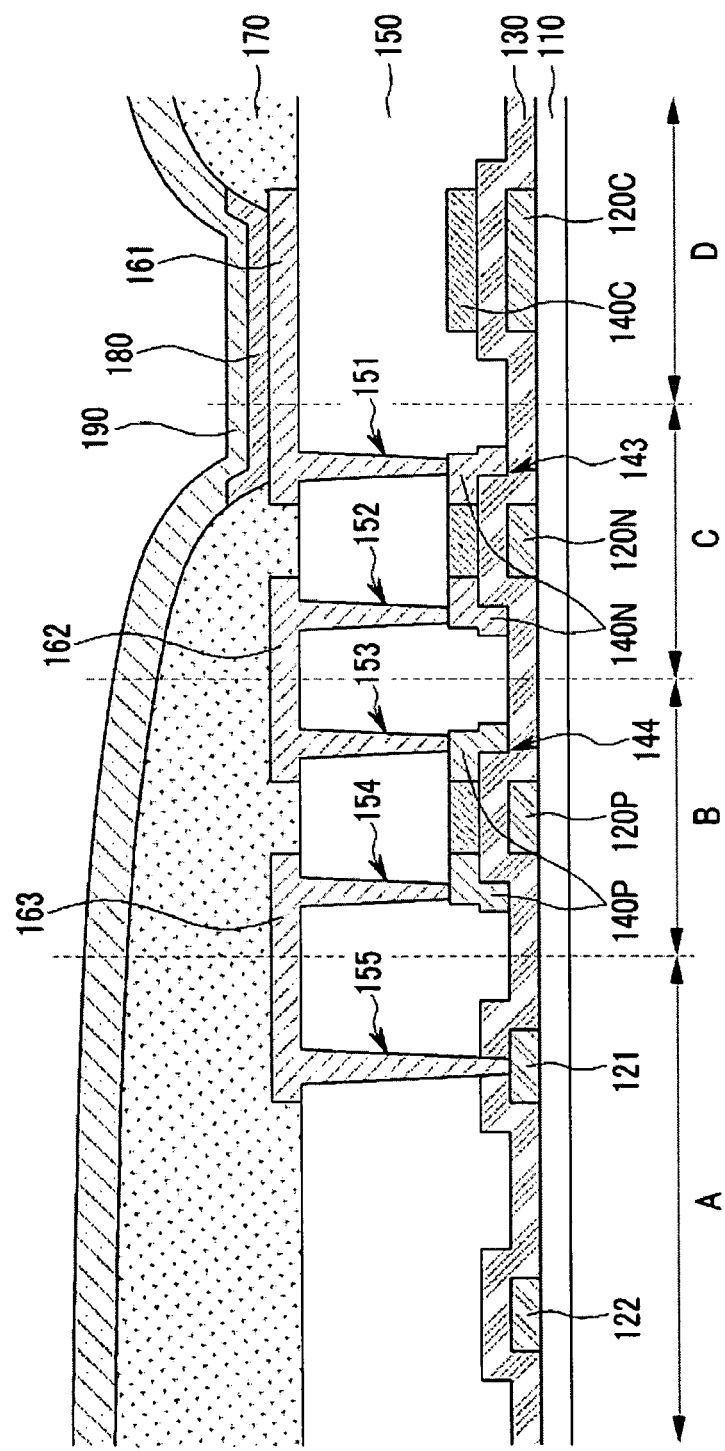

Next, referring to FIG. 8, further structures of the organic light emitting diode display may be formed by forming an organic film layer 180 including one or a plurality of emission layers (not shown) on the lower electrode 161 and forming an upper electrode 190 on the organic film layer 180.

In the organic light emitting diode display according to an example embodiment, in order to separate adjacent pixels, a pixel defining film layer (not shown) may be made of, e.g., one selected from polyimide, benzocyclobutene series resin, phenol resin, and acrylate, on the planarization layer 150. Then, a pixel defining layer 170 exposing a portion of the lower electrode 161 may be formed by etching the pixel defining film layer. Then, the organic film layer 180 may be formed on the lower electrode 180 exposed by the pixel defining layer 170.

As described above, in the organic light emitting diode display according to an example embodiment, the capacitor lower electrode 120C may be formed by etching the first conductive material layer in the fourth region D, which is separated from the first region A, second region B, and third region C on the substrate 110, and the capacitor upper electrode 140C may be formed by etching the polysilicon layer 140. In another implementation (not shown), the capacitor lower electrode and the capacitor upper electrode may be formed in the second region B or the third region C, and the capacitor lower electrode may be formed by etching the polysilicon layer 140 and the capacitor upper electrode may be formed by etching the second conductive material layer (i.e., capacitor upper electrode may be formed from the material layer used to form the first connection electrode 162, the second connection electrode 163, and the lower electrode 161).

As described above, according example embodiments, it may be possible to reduce the number of masks used in the manufacturing process of an organic light emitting diode display including a CMOS thin film transistor. An example embodiment includes forming the CMOS thin film transistors as bottom-gate types (in which a gate electrode is positioned under a semiconductor layer), forming signal wires simultaneously with the gate electrode of the CMOS thin film transistors, and connecting the CMOS thin film transistors with the signal wires through a conductive material layer that may also be used for forming a lower electrode of the organic light emitting diode.

Generally, in an active matrix type organic light emitting diode display, a driving transistor may need to provide a high current driving ability to supply a constant driving current to the organic light emitting diode, whereas a switching transistor may need to keep current leakage low in order to determine the on/off of the driving transistor. It may be difficult to satisfy both functions of the switching transistor and the driving transistor in each pixel using only an NMOS thin film transistor or only a PMOS thin film transistor. In contrast, according to an embodiment, an organic light emitting diode display may be formed using CMOS structures, i.e., having both NMOS and PMOS thin film transistors, which may improve luminous efficiency.

Generally, ten to twelve masks, which is a relatively large number, may be used to form both the NMOS thin film transistor and PMOS thin film transistor in the organic light emitting diode display implementing CMOS thin film transistors. Thus, the cost and time required for the manufacturing process may be increased, and particles generated in the process of arranging the masks may increase, such that the manufacturing process efficiency of the organic light emitting diode display is reduced. In contrast, according to an embodiment, an organic light emitting diode display may have a structure that provides advantages in terms of improving the entire manufacturing process efficiency. The structure of the organic light emitting diode display may include a CMOS thin film transistor, and the manufacturing process may be ordered to reduce the number of masks used in the manufacture of the organic light emitting diode display. Thus, embodiments may provide for reductions in manufacturing cost, manufacturing time, alignment errors, and particles generated by the masks. CMOS thin film transistors may be formed as a bottom-gate type, in which a gate electrode is positioned under a semiconductor layer. Further, signal wires may be formed simultaneously with the gate electrodes of the CMOS thin film transistors. Further, the CMOS thin film transistors may be connected with the signal wires through a conductive material layer for forming a lower electrode of the organic light emitting diode.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. A display, comprising:
    a substrate including a first region, a second region, and a third region;
    a plurality of signal wires disposed in the first region on the substrate;
    a first gate electrode disposed in the second region on the substrate;
    a second gate electrode disposed in the third region on the substrate;
    a gate insulating layer disposed on the signal wires, the first gate electrode, and the second gate electrode;
    a first semiconductor layer disposed in the first region of the gate insulating layer and including a first source/drain region doped with a p-type impurity;
    a second semiconductor layer disposed in the second region of the gate insulating layer and including a second source/drain region doped with an n-type impurity;
    a planarization layer disposed on the first semiconductor layer and the second semiconductor layer and having a first contact hole exposing a portion of the first source/drain region, a second contact hole exposing a portion of the second source/drain region, and a third contact hole exposing a portion of any one of the signal wires;
    a first connection electrode disposed on the planarization layer and connecting one side of the first source/drain region and one side of the second source/drain region through the first contact hole and the second contact hole;
    a second connection electrode disposed on the planarization layer and connecting the other side of the first source/drain region with any one of the signal wires through the first contact hole and the third contact hole;
    a lower electrode disposed on the planarization layer and connected with the other side of the second source/drain region through the second contact hole;
    an organic film layer including one or a plurality of emission layers on the lower electrode; and
    an upper electrode disposed on the organic film layer,
    wherein the signal wires, the first gate electrode, and the second gate electrode are made of a same material.

2. The display as claimed in claim 1, wherein the signal wires, the first gate electrode, and the second gate electrode are made of molybdenum-tungsten, molybdenum, tungsten silicide, molybdenum silicide, aluminum, or alloys thereof.

3. The display as claimed in claim 1, wherein the signal wires, the first gate electrode, and the second gate electrode are made of a same material.

4. The display as claimed in claim 1, wherein the n-type impurity is phosphorous (P), arsenic (As), antimony (Sb), or bismuth (Bi).

5. The display as claimed in claim 1, wherein the p-type impurity is boron (B), aluminum (Al), gallium (Ga), or indium (In).

6. The display as claimed in claim 1, wherein the lower electrode, the first connection electrode, and the second connection electrode each include a reflective layer and a transparent conductive layer.

7. The display as claimed in claim 1, wherein the lower electrode, the first connection electrode, and the second connection electrode are made of a same material.

8. The display as claimed in claim 1, wherein the signal wire connected with the second connection electrode through the first contact hole is a power source voltage line.

9. The display as claimed in claim 1, further comprising a protective layer disposed between the first semiconductor layer and the second semiconductor layer and planarization layer.

10. The display as claimed in claim 1, further comprising:
    a capacitor lower electrode disposed on the same layer as the signal wires, the first gate electrode, and the second gate electrode; and
    a capacitor upper electrode disposed on the same layer as the first semiconductor layer, and the second semiconductor layer.

11. The display as claimed in claim 1, further comprising:
    a capacitor lower electrode, the capacitor lower electrode being formed of a same material as the signal wires, the first gate electrode, and the second gate electrode;
    a capacitor dielectric, the capacitor dielectric being formed of a same material as the gate insulating layer; and
    a capacitor upper electrode, the capacitor upper electrode being formed of a same material as the first semiconductor layer and the second semiconductor layer.

12. A method of manufacturing a display, the method comprising:
    providing a substrate, the substrate including a first region, a second region, and a third region;
    forming a first conductive material layer on the substrate;
    forming a plurality of signal wires in the first region, a first gate electrode in the second region, and a second gate electrode in the third region, by etching the first conductive material layer;

forming a gate insulating layer on the signal wires, the first gate electrode, and the second gate electrode;

forming a polysilicon layer on the gate insulating layer;

doping a predetermined region of the polysilicon in the second region with a p-type impurity;

doping a predetermined region of the polysilicon in the third region with an n-type impurity;

forming a first semiconductor layer including the region of the polysilicon layer which is doped with the p-type impurity and a second semiconductor layer including the region of the polysilicon layer which is doped with the n-type impurity, by etching the polysilicon layer;

forming a planarization layer on the first semiconductor layer and the second semiconductor layer;

forming a first contact hole exposing the region of the first semiconductor layer which is doped with the p-type impurity, a second contact hole exposing the region of the second semiconductor layer which is doped with the n-type impurity, and third contact hole exposing a portion of any one of the signal wires, by etching the planarization layer;

forming a first connection electrode connecting one end of the first semiconductor layer with one end of the second semiconductor layer through the first contact hole and the second contact hole, a second connection electrode connecting the other end of the first semiconductor layer with any one of the signal wires through the first contact hole and the third contact hole, and a lower electrode connected with the other end of the second semiconductor layer through the second contact hole, on the planarization layer; and forming an organic film layer including one or a plurality of emission layers, and an upper electrode on the lower electrode.

13. The method as claimed in claim 12, wherein the conductive layer is made of tungsten, molybdenum, tungsten silicide, molybdenum silicide, aluminum, or alloys thereof.

14. The method as claimed in claim 12, wherein forming the polysilicon layer includes forming an amorphous silicon layer on the gate insulating layer and then crystallizing the amorphous silicon layer.

15. The method as claimed in claim 12, wherein the n-type impurity is phosphorous (P), arsenic (As), antimony (Sb), or bismuth (Bi).

16. The method as claimed in claim 12, wherein the p-type impurity is boron (B), aluminum (Al), gallium (Ga), or indium (In).

17. The method as claimed in claim 12, wherein the lower electrode, the first connection electrode, and the second connection electrode are each formed to include a reflective layer and a transparent conductive layer.

18. The method as claimed in claim 12, wherein the signal wire connected with the second connection electrode through the first contact hole is a power source voltage line.

19. The method as claimed in claim 12, further comprising:
    forming a protective layer on the first semiconductor layer and the second semiconductor layer;
    forming a planarization layer on the protective layer; and
    forming the contact hole, the second contact hole, and the third contact holes by etching the protective layer and the planarization layer.

20. The method as claimed in claim 12, further comprising:
    forming a capacitor lower electrode simultaneously with the signal wires, the first gate electrode, and the second gate electrode, and
    forming a capacitor upper electrode simultaneously with the first semiconductor layer and the second semiconductor layer in etching the polysilicon layer.

* * * * *